(12) United States Patent
Kim et al.

(10) Patent No.: US 10,923,669 B2
(45) Date of Patent: Feb. 16, 2021

(54) DISPLAY DEVICE INCLUDING A BENDING AREA AND A PANEL-SHEET COUPLING LAYER

(71) Applicant: Samsung Display Co., Ltd., Yongin-si (KR)

(72) Inventors: Sung Min Kim, Yongin-si (KR); Kyung Jun Park, Hwaseong-si (KR); Kang Yong Lee, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 162 days.

(21) Appl. No.: 16/105,909

(22) Filed: Aug. 20, 2018

(65) Prior Publication Data
US 2019/0081255 A1    Mar. 14, 2019

(30) Foreign Application Priority Data
Sep. 12, 2017  (KR) .......................... 10-2017-0116555

(51) Int. Cl.
*H01L 29/08*    (2006.01)
*H01L 51/00*    (2006.01)
(Continued)

(52) U.S. Cl.
CPC ............ *H01L 51/0097* (2013.01); *B32B 3/04* (2013.01); *H01L 27/323* (2013.01);
(Continued)

(58) Field of Classification Search
CPC . H01L 51/0097; H01L 27/323; H01L 51/524; H01L 51/529; H01L 2251/558;
(Continued)

(56) References Cited

U.S. PATENT DOCUMENTS 8,736,162 B2 * 5/2014 Jin .................... G06F 1/1626
                                                313/511
9,104,368 B2 * 8/2015 Ka .................... G06F 1/1601
(Continued)

FOREIGN PATENT DOCUMENTS

KR    10-2003-0044840 A    6/2003
KR    10-2008-0006507 A    1/2008
(Continued)

*Primary Examiner* — Caleb E Henry
(74) *Attorney, Agent, or Firm* — Lewis Roca Rothgerber Christie LLP

(57) ABSTRACT

A display device includes: a display panel including a flat area and a bending area positioned adjacent to the flat area, a panel bottom sheet arranged under the display panel and overlapping with the flat area and the bending area, and a panel-sheet coupling layer between the display panel and the panel bottom sheet and including a first panel-sheet coupling part arranged across the flat area and the bending area, and a second panel-sheet coupling part overlapping with the bending area and extended continuously along a side of the first panel-sheet coupling part, a thickness of the panel-sheet coupling layer becoming smaller from a central portion of the bending area toward a side portion of the bending area, and the panel bottom sheet having a curved shape that is gentler than a curved shape of the display panel.

20 Claims, 8 Drawing Sheets

(51) Int. Cl.
*H01L 27/32* (2006.01)
*H01L 51/52* (2006.01)
*B32B 3/04* (2006.01)

(52) U.S. Cl.
CPC .......... *H01L 51/524* (2013.01); *H01L 51/529* (2013.01); *B32B 2457/206* (2013.01); *H01L 2251/5338* (2013.01); *H01L 2251/558* (2013.01)

(58) Field of Classification Search
CPC ............... H01L 2251/5338; B32B 3/04; B32B 2457/206; B32B 17/06; B32B 23/08; B32B 9/04; B32B 7/12; B32B 27/32; B32B 2307/50; B32B 2307/732; B32B 2457/202; B32B 9/041; B32B 15/082; B32B 27/08; B32B 27/40; B32B 9/045; B32B 15/08; B32B 9/007; B32B 27/281; B32B 2307/212; B32B 2307/558; B32B 2307/51; B32B 2307/30; B32B 2250/44; B32B 2307/546; B32B 2307/724; B32B 2307/412; B32B 27/36; B32B 27/325; B32B 5/142; B32B 27/283; B32B 3/30; B32B 15/095; B32B 27/365; B32B 27/286; B32B 15/20; B32B 3/263; B32B 27/308; Y02E 10/549
See application file for complete search history.

(56) References Cited

U.S. PATENT DOCUMENTS

| | | | | |
|---|---|---|---|---|
| 9,379,355 | B1* | 6/2016 | Lee | H01L 27/3276 |
| 9,662,928 | B2* | 5/2017 | Chen | B44C 1/10 |
| 9,697,764 | B2* | 7/2017 | Kim | G06F 1/1652 |
| 9,817,261 | B2* | 11/2017 | Lee | H05K 999/99 |
| 9,864,477 | B2* | 1/2018 | Ryu | H01L 27/323 |
| 9,886,112 | B2* | 2/2018 | Namkung | G06F 1/1637 |
| 9,933,870 | B2* | 4/2018 | You | G06F 3/041 |
| 9,971,380 | B2* | 5/2018 | Choi | H01L 51/0097 |
| 9,980,326 | B2* | 5/2018 | Kim | H05B 33/04 |
| 10,008,693 | B2* | 6/2018 | Tang | H01L 51/0097 |
| 10,054,988 | B2* | 8/2018 | Jin | G06F 1/1626 |
| 10,111,301 | B2* | 10/2018 | Ka | G06F 1/1643 |
| 10,194,540 | B2* | 1/2019 | Sun | H01L 51/5237 |
| 10,285,265 | B2* | 5/2019 | Sun | H01L 51/5237 |
| 10,342,120 | B2* | 7/2019 | Park | G02F 1/133305 |
| 10,509,439 | B2* | 12/2019 | Choi | H04M 1/0266 |
| 10,582,612 | B2* | 3/2020 | Kwon | G06F 1/1637 |
| 2011/0050657 | A1* | 3/2011 | Yamada | H01L 27/3293 345/204 |
| 2012/0114901 | A1* | 5/2012 | Uraji | B32B 1/00 428/121 |
| 2013/0002133 | A1* | 1/2013 | Jin | H01L 51/0097 313/511 |
| 2013/0002572 | A1* | 1/2013 | Jin | G06F 1/1637 345/173 |
| 2013/0002583 | A1* | 1/2013 | Jin | G06F 1/1637 345/173 |
| 2013/0083496 | A1* | 4/2013 | Franklin | G06F 1/1626 361/749 |
| 2014/0042406 | A1* | 2/2014 | Degner | H01L 27/326 257/40 |
| 2014/0104762 | A1* | 4/2014 | Park | G06F 1/1652 361/679.01 |
| 2014/0139984 | A1* | 5/2014 | Jung | G06F 1/1637 361/679.01 |
| 2014/0168090 | A1* | 6/2014 | Aaltonen | G06F 1/1601 345/173 |
| 2014/0217382 | A1* | 8/2014 | Kwon | H01L 51/0097 257/40 |
| 2014/0367644 | A1* | 12/2014 | Song | H01L 51/5246 257/40 |
| 2015/0108439 | A1* | 4/2015 | Kim | H01L 51/5256 257/40 |
| 2015/0177450 | A1* | 6/2015 | Ahn | G02B 6/0088 362/606 |
| 2015/0256658 | A1* | 9/2015 | Shin | G06F 1/1637 455/566 |
| 2015/0277131 | A1* | 10/2015 | Park | H05K 5/0017 349/58 |
| 2015/0331451 | A1* | 11/2015 | Shin | G06F 1/1637 345/173 |
| 2016/0062516 | A1* | 3/2016 | Jeong | G06F 3/044 345/174 |
| 2016/0093644 | A1* | 3/2016 | Ki | H01L 29/78672 257/40 |
| 2016/0155788 | A1* | 6/2016 | Kwon | H01L 27/3276 257/40 |
| 2016/0359132 | A1* | 12/2016 | Sun | H01L 51/524 |
| 2017/0069664 | A1* | 3/2017 | Nakamura | H01L 27/124 |
| 2017/0069867 | A1* | 3/2017 | Hirakata | H01L 51/56 |
| 2017/0077147 | A1* | 3/2017 | Kwon | G02F 1/1345 |
| 2017/0179423 | A1* | 6/2017 | Kwon | H01L 27/323 |
| 2017/0200915 | A1* | 7/2017 | Lee | G02B 5/3033 |
| 2017/0205927 | A1* | 7/2017 | Lee | G06F 1/1637 |
| 2017/0222177 | A1* | 8/2017 | Matsueda | G06F 1/1652 |
| 2017/0294609 | A1* | 10/2017 | Namkung | H01L 27/3244 |
| 2017/0352834 | A1* | 12/2017 | Kim | H01L 27/3276 |
| 2019/0131565 | A1* | 5/2019 | Kwon | G06F 1/1601 |

FOREIGN PATENT DOCUMENTS

| | | |
|---|---|---|
| KR | 10-2009-0075784 A | 7/2009 |
| KR | 10-2009-0076883 A | 7/2009 |
| KR | 10-2009-0122170 A | 11/2009 |
| KR | 10-2011-0130374 A | 12/2011 |
| KR | 10-2014-0043664 A | 4/2014 |
| KR | 10-2014-0044579 A | 4/2014 |
| KR | 10-2014-0052714 A | 5/2014 |
| KR | 10-1465580 B1 | 11/2014 |
| KR | 10-2015-0033969 A | 4/2015 |
| KR | 10-2015-0036443 A | 4/2015 |
| KR | 10-2015-0063830 A | 6/2015 |
| KR | 10-2015-0070162 A | 6/2015 |
| KR | 10-2015-0084257 A | 7/2015 |
| KR | 10-2015-0104505 A | 9/2015 |
| KR | 10-2016-0000967 A | 1/2016 |
| KR | 10-2016-0004457 A | 1/2016 |
| KR | 10-2016-0020702 A | 2/2016 |
| KR | 10-2016-0037405 A | 4/2016 |
| KR | 10-2016-0050815 A | 5/2016 |
| KR | 10-2016-0076974 A | 7/2016 |
| KR | 10-2016-0119382 A | 10/2016 |
| KR | 10-2017-0005929 A | 1/2017 |
| KR | 10-2017-0020671 A | 2/2017 |

\* cited by examiner

DISPLAY DEVICE INCLUDING A BENDING AREA AND A PANEL-SHEET COUPLING LAYER

CROSS-REFERENCE TO RELATED APPLICATION

This application claims priority to and the benefit of Korean Patent Application No. 10-2017-0116555, filed on Sep. 12, 2017 in the Korean Intellectual Property Office, the entire disclosure of which is incorporated herein by reference.

BACKGROUND

1. Field

Aspects of embodiments of the present disclosure relate to a display device.

2. Description of the Related Art

Organic light-emitting display devices have advantages, such as good luminance, low driving voltage, fast response speed, and a wide range of color reproduction, and, accordingly, are being employed by a variety of devices including smartphones.

Such organic light-emitting display devices are commonly used in portable electronic devices such as smartphones, and are likely to be subjected to shock. In addition, if excessive heat is generated in an organic light-emitting element or a driving chip for driving it, the element may be damaged. In order to protect the elements from such damage, a functional sheet having functions of heat dissipation and buffering is attached to the lower surface of the display panel.

An organic light-emitting display device may have a shape in which at least one side thereof is bent outwardly. When this happens, the functional sheet disposed under the display panel may be bent at a larger curvature than the display panel, such that a restoring force may be applied to the functional sheet to return to the original flat shape. When a restoring force acts on the functional sheet, the functional sheet may be detached from the display panel.

SUMMARY

According to an aspect of embodiments of the present disclosure, a panel bottom sheet disposed under a display panel has a gentler curvature.

It is to be understood that aspects of the present invention are not limited to the above-mentioned aspect; and other aspects of the present invention will be apparent to those skilled in the art from the following description.

According to an aspect of one or more embodiments of the inventive concept, a display device comprises: a display panel comprising a flat area and a bending area positioned adjacent to the flat area, a panel bottom sheet arranged under the display panel and overlapping with the flat area and the bending area, and a panel-sheet coupling layer between the display panel and the panel bottom sheet and comprising a first panel-sheet coupling part arranged across the flat area and the bending area, and a second panel-sheet coupling part overlapping with the bending area and extended continuously along a side of the first panel-sheet coupling part, wherein a thickness of the panel-sheet coupling layer becomes smaller from a central portion of the bending area toward a side portion of the bending area, and wherein the panel bottom sheet has a curved shape that is gentler than a curved shape of the display panel.

According to another aspect of one or more embodiments of the inventive concept, a display device comprises: a display panel comprising a flat area and a bending area located adjacent to the flat area, and a coupling layer coupled with the display panel and comprising a first area arranged in the bending area to be bent with the bending area, and a second area arranged in the flat area, wherein the coupling layer comprises a first coupling part arranged across the first area and the second area, and a second coupling part arranged on the first coupling part and overlapping with the first area, and wherein a thickness of the coupling layer decreases from a center portion of the first area toward an outer side of the first area.

According to another aspect of one or more embodiments of the inventive concept, a display device comprises: a display panel comprising a first flat area, a second flat area positioned around the first flat area, and a bending area connecting the first flat area with the second flat area, a panel bottom sheet arranged under the display panel and overlapping with the first flat area, the second flat area, and the bending area, and a panel-sheet coupling layer interposed between the display panel and the panel bottom sheet and comprising a first panel-sheet coupling part arranged across the first flat area, the second flat area, and the bending area, and a second panel-sheet coupling part overlapping with the bending area and arranged on the first panel-sheet coupling part, wherein a thickness of the panel-sheet coupling layer is larger in a center portion of the bending area than at a boundary between the bending area and the second flat area, and wherein a radius of curvature of the panel bottom sheet is larger than a radius of curvature of the display panel in the bending area.

According to an aspect of one or more exemplary embodiments of the present disclosure, a coupling strength between the display panel and the panel bottom sheet can be increased, and a restoring force acting on the panel bottom sheet can be reduced. By doing so, the panel bottom sheet may not be separated from the display panel and can perform as designed. In addition, the panel bottom sheet can be tightly coupled with the display panel with no space to be lifted, and thus it is possible to prevent or substantially prevent external foreign matter from penetrating into the display device.

It is to be understood that effects of the present disclosure are not limited to those described above, and other effects of the present disclosure will be apparent to those skilled in the art from the following description.

BRIEF DESCRIPTION OF THE DRAWINGS

The above and other aspects and features of the present disclosure will become more apparent by describing in further detail some exemplary embodiments thereof with reference to the attached drawings, in which.

DETAILED DESCRIPTION

Figure 1:
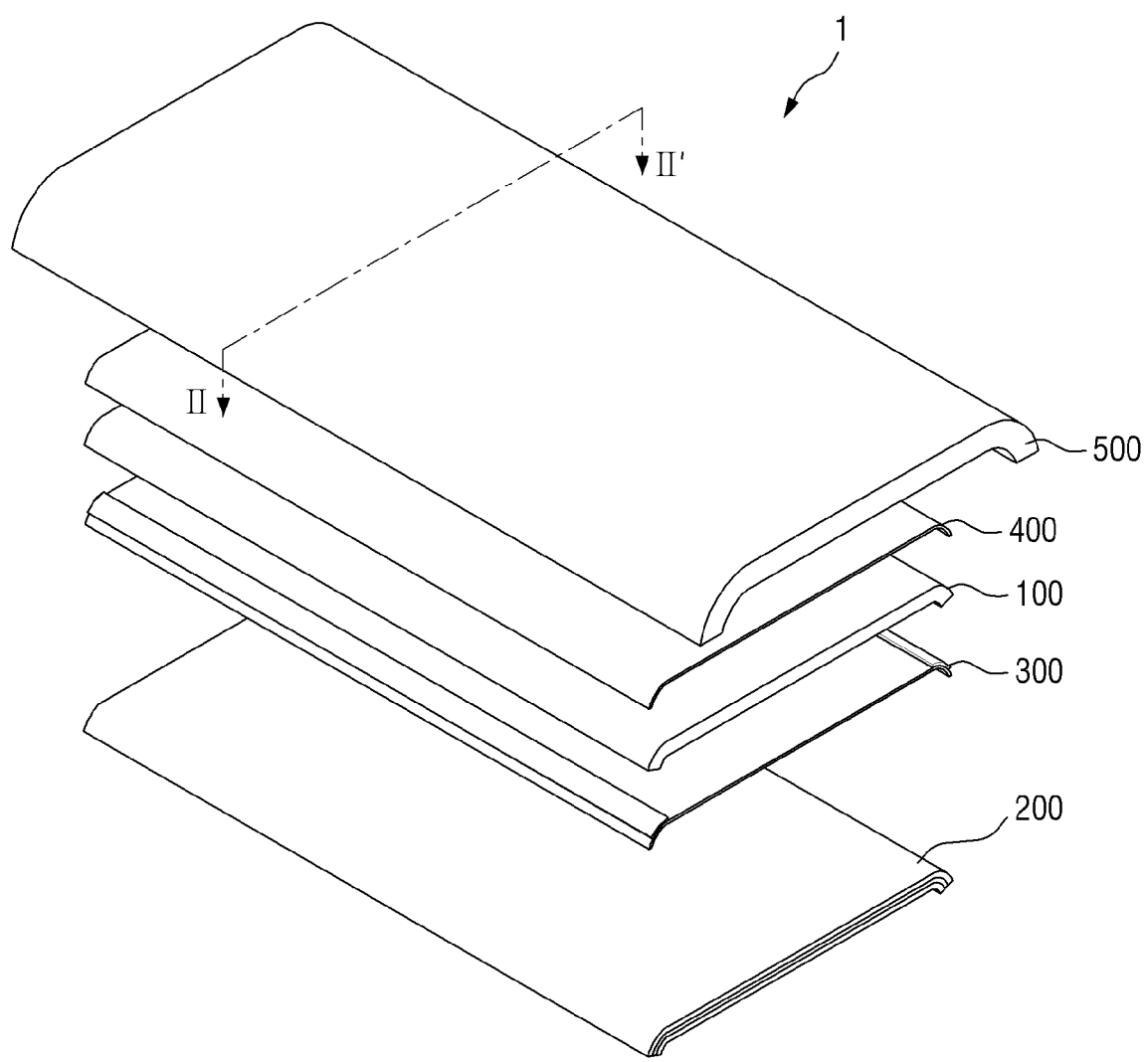
FIG. 1 is an exploded perspective view of a display device according to an exemplary embodiment of the present disclosure.

Aspects and features of the present disclosure and methods of accomplishing the same may be understood more readily by reference to the following description of some exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art.

Cases in which elements or layers are referred to as being located "on" other elements or layers include cases in which one or more other elements or layers are interposed directly on or between other elements. Meanwhile, cases in which the elements are referred to as being "directly on" indicate that no other element or layer is interposed therebetween. Same reference numerals refer to the same constituent elements throughout the specification. The term "and/or" includes each and every combination of one or more of the referenced items.

It is to be understood that, although the terms "first," "second," etc. may be used herein to describe various elements, these elements should not be limited by these terms. Rather, these terms are used to distinguish one element from another element. Thus, a "first" element discussed below could be termed a "second" element without departing from the teachings of the present invention.

Herein, some exemplary embodiments of the present disclosure will be described with reference to the accompanying drawings.

Figure 2:
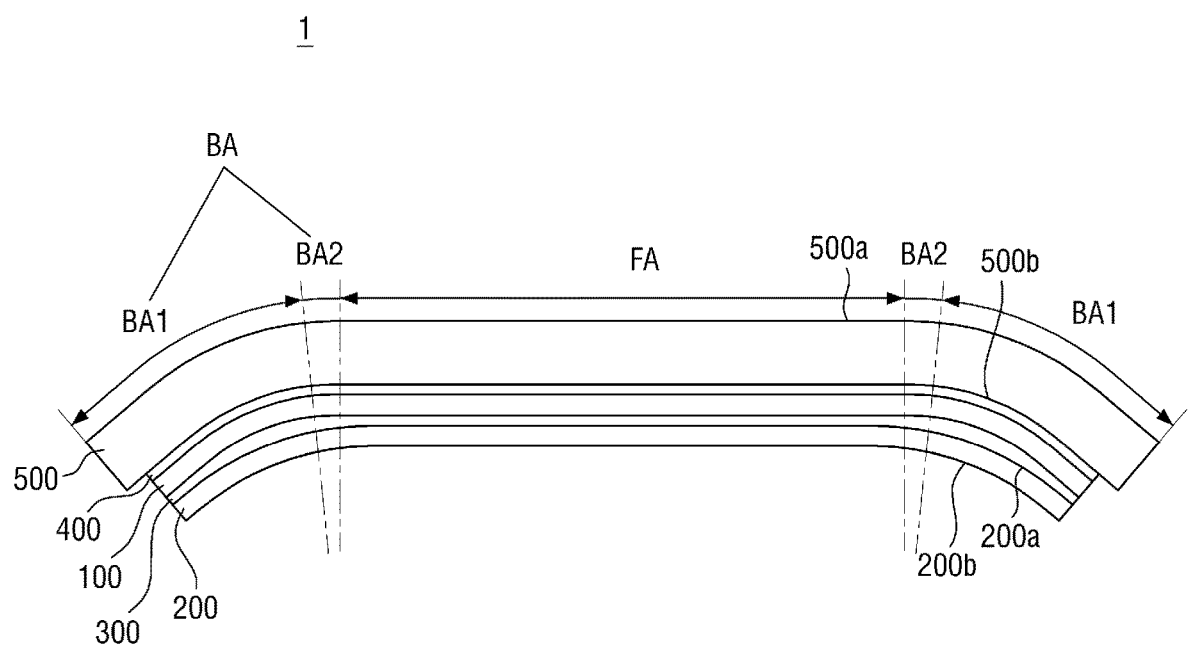
FIG. 2 is a cross-sectional view of the display device of FIG. 1, taken along the line II-II', shown in an assembled state.

FIG. 1 is an exploded, perspective view of a display device according to an exemplary embodiment of the present disclosure. FIG. 2 is a cross-sectional view of the display device of FIG. 1, taken along the line II-II', shown in an assembled state.

Referring to FIGS. 1 and 2, a display device 1 includes a display panel 100 and a panel bottom sheet 200 disposed under the display panel 100. The display device 1 may further include a window 500 disposed on the display panel 100. As used herein, "top" and "upper surface" refers to the side of the display panel 100 in which images are displayed, whereas "bottom" and "lower surface" refers to the opposite side of the display panel 100, unless stated otherwise.

In an embodiment, the display device 1 may have a rectangular shape when viewed from the top. The display device 1 may include two shorter sides and two longer sides. The corners where the longer sides and the shorter sides of the display device 1 meet may form a right angle, although the present invention is not limited thereto. For example, FIG. 1 shows rounded corners. The shape of the display device 1 when viewed from the top is not limited to that shown in the drawings. For example, the display device 1 may have a circular shape or any of other shapes.

The display panel 100 is for displaying a screen. For example, an organic light-emitting display panel may be employed. In the following description, the organic light-emitting display panel is described as the display panel 100. It is, however, to be understood that other types of display panels, such as a liquid-crystal display panel and an electrophoretic display panel, may also be employed.

The display panel 100 includes a plurality of organic light-emitting elements disposed on a substrate. The substrate may be a rigid substrate made of glass or the like, or a flexible substrate made of polyimide (PI) or the like. When the flexible substrate is used as the substrate, the display panel 100 may be curved, bent, folded, or rolled.

The window 500 is disposed on the display panel 100. The window 500 is disposed on the display panel 100 to protect the display panel 100 and transmits the light exiting from the display panel 100. The window 500 may be made of glass or the like, or may be made of a plastic material, such as polyimide or the like.

The window 500 may be disposed to overlap the display panel 100 and cover the surface (e.g., the entire surface) of the display panel 100. In an embodiment, the window 500 may be larger than the display panel 100. For example, the window 500 may protrude outwardly from the shorter sides of the display panel 100.

A transparent coupling layer 400 may be interposed between the window 500 and the display panel 100. The transparent coupling layer 400 couples the window 500 with the display panel 100 and is made of an adhesive material, such as optical transparent adhesive (OCA) or optical transparent resin (OCR).

In an exemplary embodiment, a touch member (not shown) may be disposed between the display panel 100 and the window 500. The touch member may be in the form of a panel or a film. For example, the touch member may have substantially the same size as the display panel 100 and may overlap the display panel 100. The side surfaces of the touch member may be aligned with the side surfaces of the display panel 100. The display panel 100 and the touch member, and the touch member and the window 500 may be coupled with each other by a transparent coupling layer 400. In an embodiment, the transparent coupling layer 400 may include an optical transparent adhesive (OCA) or an optical transparent resin (OCR).

The panel bottom sheet 200 may be disposed under the display panel 100. A panel-sheet coupling layer 300 may be disposed between the panel bottom sheet 200 and the display panel 100. The panel bottom sheet 200 may be attached under the display panel 100 by the panel-sheet coupling layer 300.

The panel bottom sheet 200 may perform a heat dissipation function, electromagnetic wave shielding function, grounding function, buffering function, strength enhancing function and/or digitizing function. The panel bottom sheet 200 and the panel-sheet coupling layer 300 will be described in more detail below.

In an exemplary embodiment, the display device 1 may include a flat area FA and bending areas BA that are connected to the flat area FA and positioned at the sides of the flat area FA. The flat area FA is located generally on one plane. The bending areas BA are not disposed on the same plane as the flat area FA. For example, the bending areas BA may be bent or curved downwardly from the plane where the flat area FA is located.

In an exemplary embodiment, each of the bending areas BA may include a convex surface that is curved outwardly. The bending area BA may include a first bending area BA1 and a second bending area BA2 having different curvatures. The first bending area BA1 may have a greater curvature than a curvature of the second bending area BA2. In other words, the second bending area BA2 may have a gentle inclination compared to the first bending area BA1. In an exemplary embodiment, the second bending area BA2 may have such a gentle inclination that a user may perceive that it is coplanar with the flat area FA. For example, the slope of the tangent line of the second bending area BA2 with respect to the plane on which the flat area FA is located may be 5° or less.

The first bending area BA1 may be located more to the outside than the second bending area BA2. That is, the second bending area BA2 is disposed between the first bending area BA1 and the flat area FA to connect the first bending area BA1 and the flat area FA.

The bending area BA may be disposed on either longer side or one of the longer sides of the rectangular display device 1. In an embodiment, although not shown in the drawings, the shorter sides of the display device 1 may also be bent. In an embodiment, the bending area BA may be disposed on all of the sides of the rectangular display device 1. In other words, the display device 1 may include four bending areas BA disposed on the four sides, respectively.

The display panel 100, the window 500, the panel bottom sheet 200, and the adhesive layers 300 and 400 may all be positioned across the flat area FA and the bending area BA.

Herein, the above-described panel bottom sheet 200 and the panel-sheet coupling layer 300 will be described in more detail.

Figure 3:
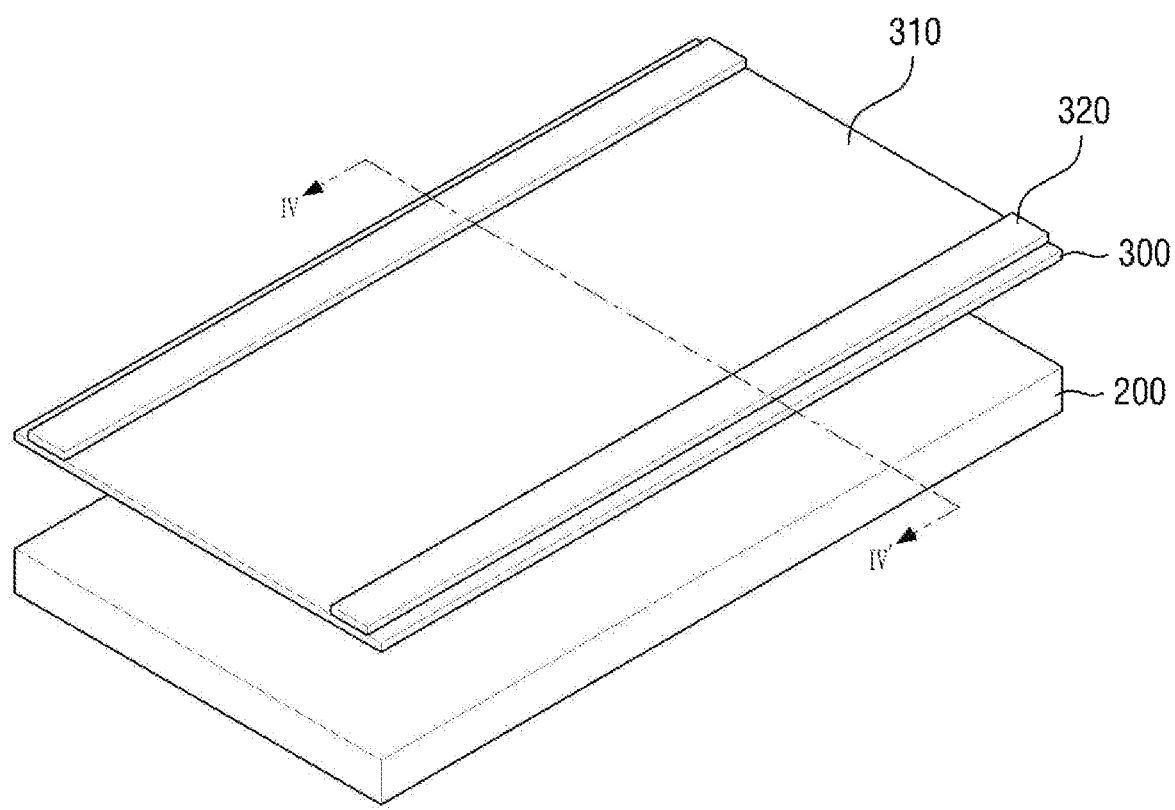
FIG. 3 is an exploded perspective view of a panel bottom sheet and a panel-sheet coupling layer according to an exemplary embodiment of the present disclosure.
Figure 4:
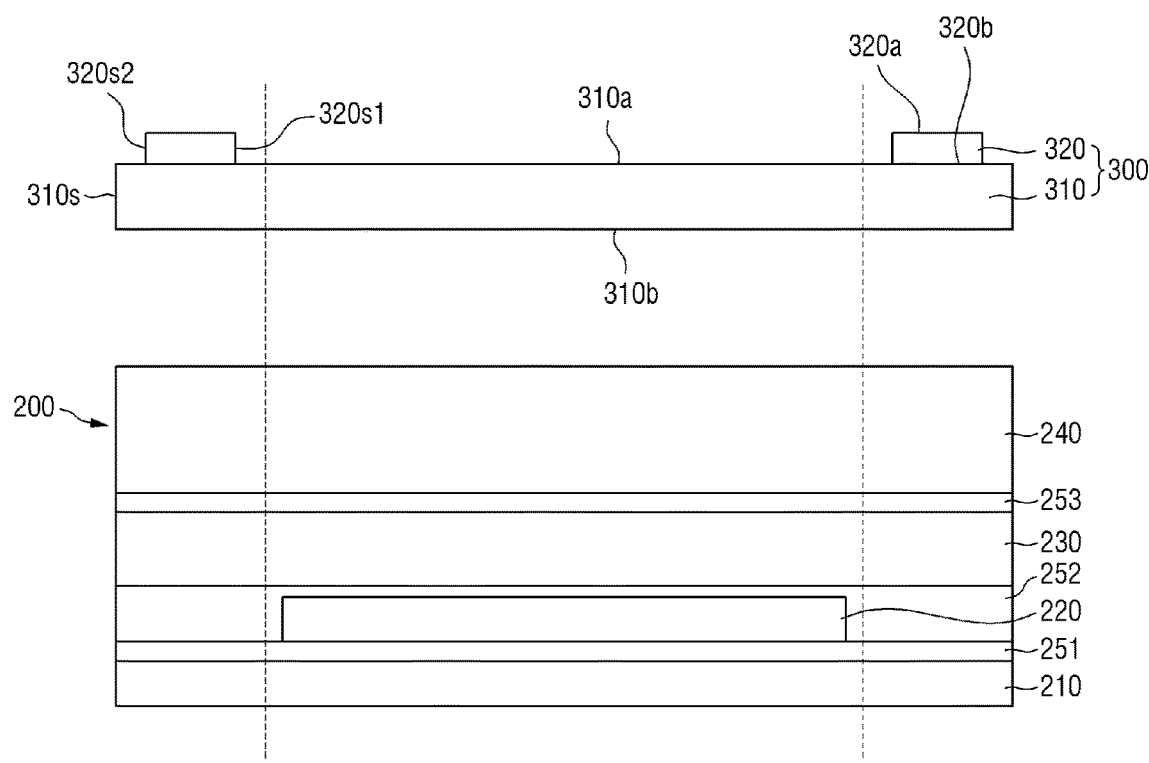
FIG. 4 is a cross-sectional view of the panel bottom sheet and the panel-sheet coupling layer of FIG. 3, taken along the line IV-IV'.

FIG. 3 is an exploded perspective view of a panel bottom sheet and a panel-sheet coupling layer according to an exemplary embodiment of the present disclosure. FIG. 4 is a cross-sectional view of the panel bottom sheet and the panel-sheet coupling layer of FIG. 3, taken along the line IV-IV'.

In FIGS. 3 and 4, the panel bottom sheet 200 and the panel-sheet coupling layer 300 have a generally flat shape for convenience of illustration. When the flat panel bottom sheet 200 and the panel-sheet coupling layer 300 are attached to the display panel 100, they are bent together. In FIG. 4, the flat area FA and the bending area BA are shown divided by dotted lines.

The panel bottom sheet 200 includes one or more functional layers which may perform a heat dissipation function, an electromagnetic wave shielding function, a grounding function, a buffering function, a strength enhancing function, a supporting function, and/or a digitizing function. The functional layer may be a sheet layer made of a sheet, a film layer made of a film, a thin film layer, a coating layer, a panel, a plate, or the like.

The panel bottom sheet 200 may include a plurality of functional layers and one or more interlayer coupling layers for coupling them. The functional layers may overlap with one another. Adjacent functional layers may be coupled with one another by the respective interlayer coupling layers. In an embodiment, the functional layers and the interlayer coupling layers may have the same size when viewed from the top. However, this is merely illustrative. In an embodiment, some or all of the functional layers and the interlayer coupling layers may have different sizes. In addition, some of the functional layers and the interlayer coupling layers may protrude outwardly from the other layers in a specific direction or in all directions.

In an exemplary embodiment, the panel bottom sheet 200 may include a first heat dissipation layer 210, a second heat dissipation layer 220, a support substrate 230, a buffer member 240, and first to third interlayer coupling layers 251, 252, and 253 for connecting them.

In an embodiment, the first heat dissipation layer 210 is located at the bottom of the panel bottom sheet 200, and a lower surface of the first heat dissipation layer 210 defines a lower surface 200b (see FIG. 2) of the panel bottom sheet 200. The first interlayer coupling layer 251 is disposed on an upper surface of the first heat dissipation layer 210. A second heat dissipation layer 220 is disposed on an upper surface of the first interlayer coupling layer 251. The first heat dissipation layer 210 and the second heat dissipation layer 220 may be coupled with each other by the first interlayer coupling layer 251.

In an embodiment, the first heat dissipation layer 210 may include a metal thin film, such as copper or silver, and, in an embodiment, the second heat dissipation layer 220 may include graphite, carbon nanotubes, or the like. In an embodiment, the first interlayer coupling layer 251 may include an epoxy-based material or an acryl-based material that can be cured by heat.

The first heat dissipation layer 210 may be disposed across the flat area FA and the bending area BA. The second heat dissipation layer 220 may not be disposed in the bending area BA, but only in the flat area FA.

The second interlayer coupling layer 252 and the support substrate 230 may be sequentially disposed on an upper surface of the second heat dissipation layer 220. The second interlayer coupling layer 252 may cover the second heat dissipation layer 220 to be extended to the exposed first interlayer coupling layer 251. The periphery of the second interlayer coupling layer 252 may be in direct contact with the first interlayer coupling layer 251 in the bending area BA. The support substrate 230 may have a same size as the first heat dissipation layer 210 when viewed from the top. In an embodiment, the side surfaces of the support substrate 230, the second interlayer coupling layer 252, the first interlayer coupling layer 251, and the first heat dissipation layer 210 may be aligned.

In an embodiment, the second interlayer coupling layer 252 may be made of a same material as the first interlayer coupling layer 251. The support substrate 230 may be made of, for example, polyimide (PI), polyethylene terephthalate (PET), polycarbonate (PC), polyethylene (PE), polypropylene (PP), polysulfone (PSF), polymethylmethacrylate (PMMA), triacetylcellulose (TAC), cycloolefin polymer (COP), etc. The support substrate 230 can also perform a buffer function when it has a certain thickness, such as a thickness of 20 μm or more.

The third interlayer coupling layer 253 and the buffer member 240 may be sequentially disposed on an upper surface of the support substrate 230. An upper surface of the buffer member 240 may define an upper surface 200a (see FIG. 2) of the panel bottom sheet 200.

The buffer member 240 absorbs an external impact to prevent or substantially prevent the display device 1 from being damaged. The buffer member 240 may be made up of a single layer or a stack of multiple layers. In an embodiment, the buffer member 240 may include a material having elasticity, such as polyurethane or a polyethylene resin.

The panel-sheet coupling layer 300 may be disposed on the panel bottom sheet 200. Although, in an embodiment, the panel-sheet coupling layer 300 may be provided as a separate member from the panel bottom sheet 200, the panel-sheet coupling layer 300 may be incorporated into the panel bottom sheet 200 as a top coupling layer.

In an exemplary embodiment, the panel-sheet coupling layer 300 may be a pressure-sensitive adhesive (PSA). The panel-sheet coupling layer 300 may include a substrate, a first coupling layer disposed on a lower surface of the substrate, and a second coupling layer disposed on an upper surface of the substrate. The substrate may be made of, for example, polyethylene terephthalate (PET), polyimide (PI), polycarbonate (PC), polyethylene (PE), polypropylene (PP), polysulfone (PSF), polymethylmethacrylate (PMMA), triacetylcellulose (TAC), cycloolefin polymer (COP), etc.

The first coupling layer and the second coupling layer may include an adhesive layer, a viscous layer, or a resin layer. For example, the first coupling layer and the second coupling layer may contain polymer materials, such as an acrylic polymer, a silicone polymer, and a urethane polymer.

The thickness of the panel-sheet coupling layer 300 may be in a range from approximately 40 μm to 70 μm. In an embodiment, the thickness of the substrate and the thickness of the first coupling layer are rarely changed, and only the thickness of the second coupling layer may be changed. For example, when the thickness of the substrate is approximately 7 μm and the thickness of the first coupling layer is in a range from approximately 10 to 15 μm, the thickness of the second coupling layer may be in a range from approximately 23 to 48 μm.

When the thickness of the second coupling layer is approximately 23 μm or more, the panel-sheet coupling layer 300 can be reliably coupled with the display panel 100. When the thickness of the second coupling layer is approximately 48 μm or less, it is possible to prevent an increase in the overall thickness of the panel-sheet coupling layer 300, thereby allowing for a slimmer display device.

In an embodiment, the panel-sheet coupling layer 300 may have viscoelasticity. When an external pressure is applied to the panel-sheet coupling layer 300, its shape may be partially deformed. For example, the shape of the panel-sheet coupling layer 300 may be partially modified depending on the shapes of the display panel 100 and the panel bottom sheet 200.

The panel-sheet coupling layer 300 may include a first panel-sheet coupling layer 310 and a second panel-sheet coupling layer 320.

The first panel-sheet coupling layer 310 may have a same size as the panel bottom sheet 200 when viewed from the top. The first panel-sheet coupling layer 310 may be disposed across the flat area FA and the bending area BA.

The second panel-sheet coupling layer 320 has a smaller size than the first panel-sheet coupling layer 310 when viewed from the top. The second panel-sheet coupling layer 320 may be disposed only in the bending area BA and not in the flat area FA. In an embodiment, the second panel-sheet coupling layer 320 may be disposed only in the first bending area BA1.

The second panel-sheet coupling layer 320 may be in a line shape extended along a side of the first panel-sheet coupling layer 310 disposed in the first bending area BA1. For example, the second panel-sheet coupling layer 320 may be disposed along a longer portion of the first panel-sheet coupling layer 310. When the bending area BA is formed on either side of the display device 1, the second panel-sheet coupling layer 320 may be disposed on either side of the first panel-sheet coupling layer 310. In an embodiment, the second panel-sheet coupling layer 320 may be extended continuously.

In an embodiment, the second panel-sheet coupling layer 320 may have a rectangular cross-sectional shape including a top surface 320$a$, a bottom surface 320$b$, and two side surfaces 320$s$1 and 320$s$2. However, it is to be understood that this is merely illustrative, and the second panel-sheet coupling layer 320 may have any of various cross-sectional shapes, such as shown in FIGS. 7 to 11.

One side surface 320$s$1 of the second panel-sheet coupling layer 320 may be aligned with the boundary between the first bending area BA1 and the second bending area BA2. The other side surface 320$s$2 opposite to the one side surface 320$s$1 may be positioned more to the inside than a side surface 310$s$ of the first panel-sheet coupling layer 310. That is, a part of the outer side of the first panel-sheet coupling layer 310 may be exposed beyond the second panel-sheet coupling layer 320. The exposed part of the first panel-sheet coupling layer 310 may provide a space to which the second panel-sheet coupling layer 320 may expand in the width direction during a subsequent process when it receives external pressure. It is, however, to be understood that this is merely illustrative. For example, in an embodiment, the other side surface 320$s$2 of the second panel-sheet coupling layer 320 may be aligned with the side 310$s$ of the first panel-sheet coupling layer 310.

The thickness of the panel-sheet coupling layer 300 may be equal to the sum of the thickness of the first panel-sheet coupling layer 310 and the thickness of the second panel-sheet coupling layer 320. The thickness of the panel-sheet coupling layer 300 may be smaller at the outer side than in the center portion of the bending area BA. In an exemplary embodiment, the thickness of the panel-sheet coupling layer 300 in the bending area BA may become smaller toward the outer side from the center portion.

For example, when the thickness of the second panel-sheet coupling layer 320 is constant, the second panel-sheet coupling layer 320 is not disposed on the outer side of the bending area BA, such that the thickness of the panel-sheet coupling layer 300 may become different in the center portion and at the outer side of the bending area BA. However, this is merely illustrative. The thickness of the panel-sheet coupling layer 300 may become different in the center portion and at the outer side of the bending area BA by making the thickness of the second panel-sheet coupling layer 320 different. That is, by making the thickness of the second panel-sheet coupling layer 320 smaller toward the outer side of the bending area BA, it is possible to adjust the thickness of the panel-sheet coupling layer 300.

In an exemplary embodiment, the second panel-sheet coupling layer 320 may be disposed on the first panel-sheet coupling layer 310. That is, the second panel-sheet coupling layer 320 may be disposed between the first panel-sheet coupling layer 310 and the display panel 100. The second panel-sheet coupling layer 320 may be in direct contact with the first panel-sheet coupling layer 310 with no additional coupling member therebetween. For example, a second coupling layer disposed on the first panel-sheet coupling layer 310 may be in contact with a first coupling layer disposed under the second panel-sheet coupling layer 320. It is, however, to be understood that this is merely illustrative. The second panel-sheet coupling layer 320 may include only a substrate and a coupling layer disposed on the substrate. In this case, the substrate of the second panel-sheet coupling layer 320 may be in direct contact with the second coupling layer of the first panel-sheet coupling layer 310.

The second panel-sheet coupling layer 320 can enhance the coupling between the panel bottom sheet 200 and the display panel 100 in the bending area BA. In addition, the curvature of the panel bottom sheet 200 in the bending area BA can be reduced by the second panel-sheet coupling layer 320. More detailed description thereof will be given with reference to FIGS. 5 and 6.

Figure 5:
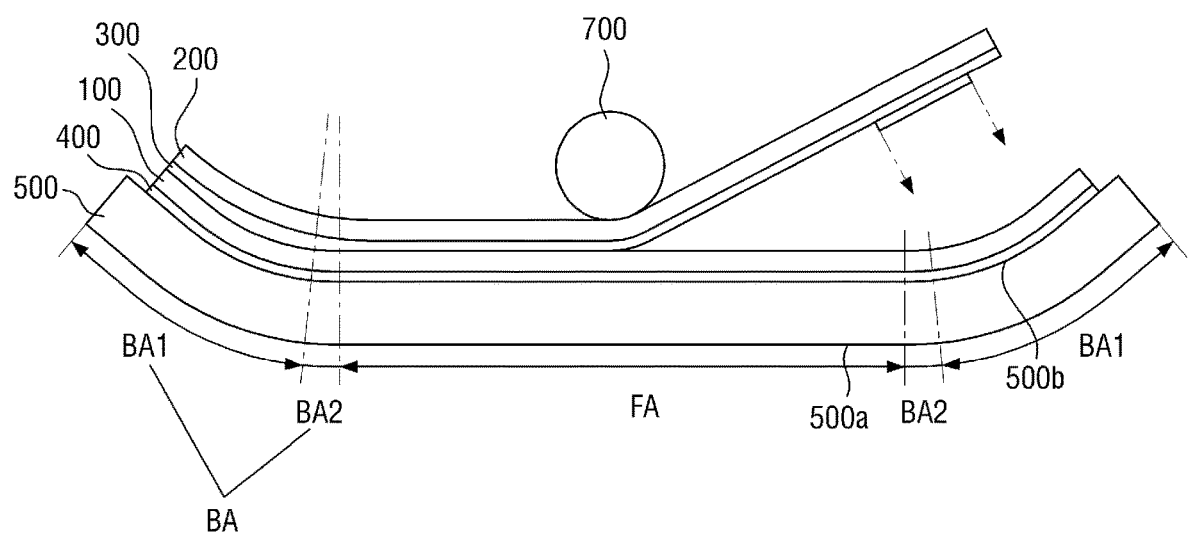
FIG. 5 is a cross-sectional view showing a process of attaching a panel bottom sheet to a display panel, according to an exemplary embodiment of the present disclosure.
Figure 6:
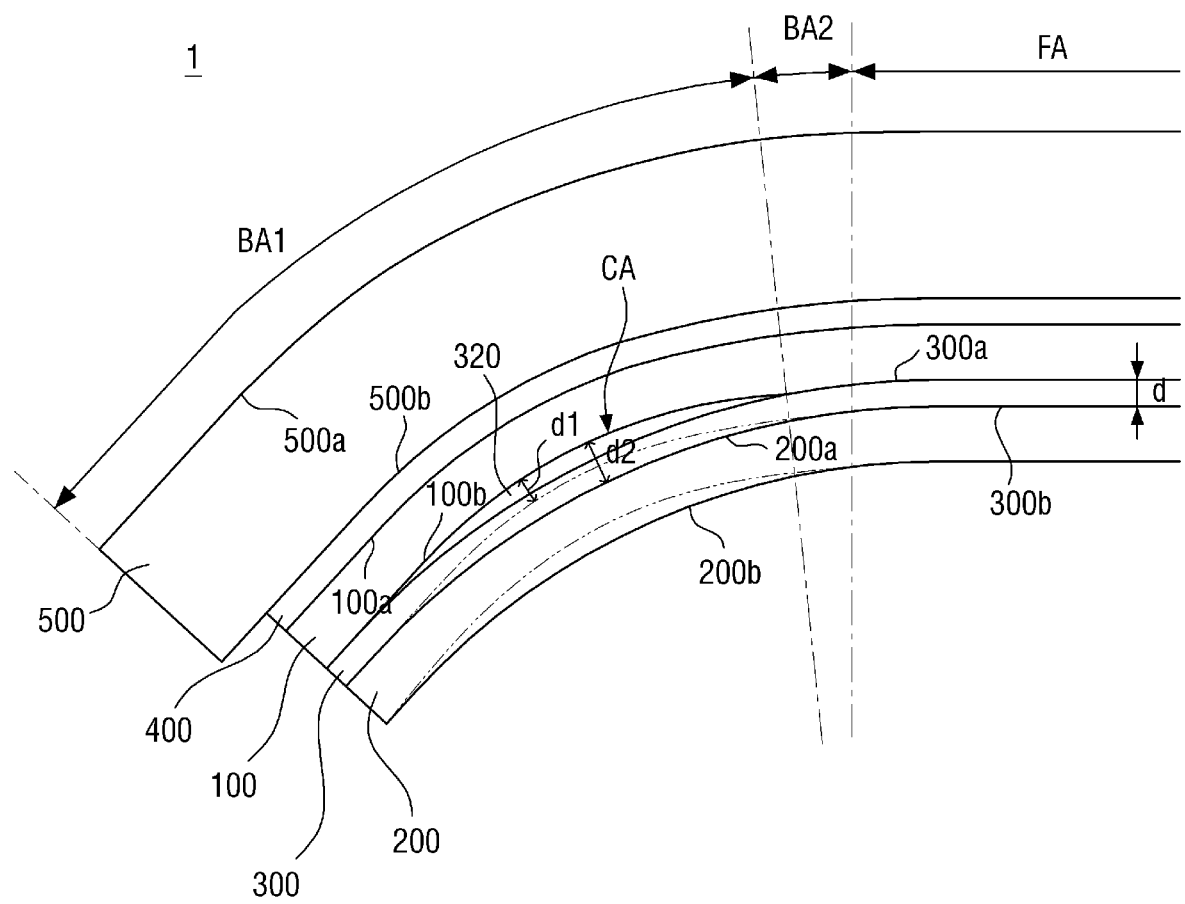
FIG. 6 is an enlarged cross-sectional view of a bending area of a display device according to an exemplary embodiment of the present disclosure.

FIG. 5 is a cross-sectional view showing a process of attaching a panel bottom sheet to a display panel, according to an exemplary embodiment of the present disclosure. FIG. 6 is an enlarged cross-sectional view of a bending area of a display device according to an exemplary embodiment of the present disclosure.

Referring to FIGS. 5 and 6, the display panel 100, the panel bottom sheet 200, and the panel-sheet coupling layer 300 are prepared to attach the panel bottom sheet 200 to the display panel 100. The display panel 100 may have the window 500 attached thereto. When the window 500 includes a bending area BA, the display panel 100 attached thereto may also include a bending area BA.

Subsequently, the panel bottom sheet 200 is disposed on a lower surface 100b of the display panel 100 with the panel-sheet coupling layer 300 therebetween, and the lower surface 200b of the panel bottom sheet 200 is pressed such that the display panel 100 is coupled with the panel bottom sheet 200. Although the panel-sheet coupling layer 300 may be coupled to the panel bottom sheet 200 and then coupled to the lower surface 100b of the display panel 100 in an exemplary embodiment, this is merely illustrative. For example, the panel-sheet coupling layer 300 and the display panel 100 may be coupled with each other first.

The second panel-sheet coupling layer 320 may be deformed conforming to the curvature of the display panel 100 and the panel bottom sheet 200 by the pressing process. Specifically, the second panel-sheet coupling layer 320 having a rectangular or square pillar shape may be deformed into a lenticular shape along the curvature of the display panel 100. The curvature of the upper surface 320a of the second panel-sheet coupling layer 320 may be equal to the curvature of the lower surface 100b of the display panel 100. In an exemplary embodiment, the radius of curvature of the upper surface 320a of the second panel-sheet coupling layer 320 may be substantially equal to the radius of curvature of the lower surface 100b of the display panel 100. As a result, in an embodiment, a space between the display panel 100 and the panel bottom sheet 200 can be completely filled with the panel-sheet coupling layer 300, leaving no empty space.

The pressing process may be performed, for example, with a rolling process. In an embodiment, a roller extending in the longitudinal direction of the display panel 100 is placed on the lower surface 200b of the panel bottom sheet 200, and the roller is moved from one longer side to the other longer side of the display panel 100, thereby pressing the entire panel bottom sheet 200.

The panel bottom sheet 200 may include a bending area BA in the same area as the bending area BA of the window 500. In a case in which the second panel-sheet coupling layer 320 is not provided, a vertical distance d between the lower surface 100b of the display panel 100 and the upper surface 200a of the panel bottom sheet 200 may be constant throughout the display area, including a vertical distance d1 in the bending area BA. In the bending area BA, the radius of curvature of the window 500, the radius of curvature of the display panel 100, and the radius of curvature of the panel bottom sheet 200 may be proportional to one another. In this case, the radius of curvature may decrease from the window 500 toward the panel bottom sheet 200. That is, the panel bottom sheet 200 may be curved more sharply than the display panel 100, such that the panel bottom sheet 200 may have a radius of curvature smaller than that of the display panel 100.

Unlike a material that holds a shape deformed by an external pressure, a material having an elasticity higher than a certain level has a restoring force to return to a shape before external pressure is applied. For example, the elastic force of a polyimide film is approximately 330 to 340 kg/mm$^2$, and the elastic force of a PET film is approximately 450 to 500 kg/mm$^2$. The polyimide film and the PET film have the restoring force to return to the original shape if an external pressure is applied.

When the panel bottom sheet 200 includes a material having a restoring force, such as a polyimide film and a PET film, it may have a restoring force to return to the original flat shape. Generally, as the radius of curvature decreases, the restoring force increases. Therefore, the restoring force of the panel bottom sheet 200 having a smaller radius of curvature than that of the window 500 and that of the display panel 100 may be considerably large.

When the panel bottom sheet 200 coupled with the display panel 100 while they are bent is returned to the original flat shape by the restoring force, the panel bottom sheet 200 may be detached from the display panel 100. Once the panel bottom sheet 200 is detached from the display panel 100, the panel bottom sheet 200 cannot perform its functions as originally designed. That is, functions such as a heat dissipation function and a buffering function may be lost, and, accordingly, the display device 1 may be adversely affected. In addition, foreign matter, such as moisture, may penetrate into the gap between the panel bottom sheet 200 and the display panel 100, which may result in a failure.

In contrast, in embodiments of the present invention, the second panel-sheet coupling layer 320 is provided, and the second panel-sheet coupling layer 320 may be used to fill a part of a curved area CA of the display panel 100. The curved area CA refers to an area under the display panel 100 created as the display panel 100 is curved outwardly. In other words, the curved area CA includes a vicinity of an arc of the lower surface 100b of the display panel 100 in the first bending area BA1. A distance d2 between the lower surface 100b of the display panel 100 and the upper surface 200a of the panel bottom sheet 200 may be increased in proportion to the thickness of the second panel-sheet coupling layer 320. The distance d between the lower surface 100b of the display panel 100 and the upper surface 200a of the panel bottom sheet 200 in the second bending area BA2 and the flat area FA in which the second panel-sheet coupling layer 320 is not disposed is smaller than the distance d2 in the bending area BA. It is noted that the distance d2 between the lower surface 100b of the display panel 100 and the upper surface 200a of the panel bottom sheet 200 on the outer side of the bending area BA, that is, on the side portion of the display device 1, may be similar to or equal to the distance d in the flat area FA. That is, the distance d2 between the display panel 100 and the lower panel sheet 200 may be the largest at the central portion of the bending area BA and may gradually decrease toward the outer side. Accordingly, a lower surface 300b of the panel-sheet coupling layer 300 may have a gentler slope than the lower surface 100b of the display panel 100. The radius of curvature of an upper surface 300a of the panel-sheet coupling layer 300 may be substantially equal to the radius of curvature of the lower surface 100b of the display panel 100. The radius of curvature of the lower surface 300b of the panel-sheet coupling layer 300 may be substantially equal to the radius of curvature of the upper surface 200a of the panel bottom sheet 200. The upper surface 300a of the panel-sheet coupling layer 300 may have a radius of curvature smaller than that of the lower surface 300b of the panel-sheet coupling layer 300 due to the second panel-sheet coupling layer 320.

The radius of curvature of the panel bottom sheet 200 disposed under the panel-sheet coupling layer 300 may be gentler according to the radius of curvature of the panel-sheet coupling layer 300. The panel bottom sheet 200 may have a radius of curvature larger than that of the display panel 100, and the panel bottom sheet 200 may have a gentler curvature than that of the display panel 100. As a result, the restoring force of the panel bottom sheet 200 to return to the original flat shape can be reduced.

In general, the coupling strength increases with the thickness of the coupling layer. By disposing the second panel-sheet coupling layer 320 in the first bending area BA1, the thickness of the coupling layer is increased, such that the coupling strength between the display panel 100 and the panel bottom sheet 200 can be further increased.

As a result, when the second panel-sheet coupling layer 320 is provided, the restoring force of the panel bottom sheet 200 can be reduced and the coupling strength can be increased, such that it is possible to suppress the panel bottom sheet 200 from being separated from the display panel 100. Thus, the panel bottom sheet 200 can perform its functions as designed. In addition, it is possible to prevent or substantially prevent foreign matter, such as moisture, from penetrating into the display panel 100.

Herein, some other exemplary embodiments will be described. In the following description, same or similar elements will be denoted by the same or similar reference numerals, and redundant description thereof will be omitted or briefly described. Description will be made focusing on differences from the above-described embodiment.

FIGS. 7 to 11 are cross-sectional views of panel-sheet coupling layers according to various exemplary embodiments of the present disclosure.

Figure 7:
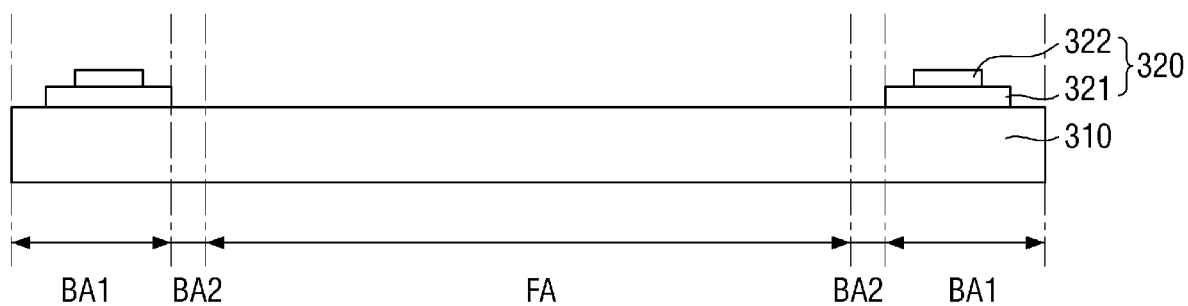
FIGS. 7 to 11 are cross-sectional views of panel-sheet coupling layers according to various exemplary embodiments of the present disclosure.

Referring to FIG. 7, a panel-sheet coupling layer 301 according to an exemplary embodiment of the present disclosure is different from the panel-sheet coupling layer 300 shown in FIG. 1 in that a second panel-sheet coupling layer 320 is made up of more than one layer.

In an exemplary embodiment, the second panel-sheet coupling layer 320 may include a first layer 321 and a second layer 322. Although two layers are shown stacked on the first panel-sheet coupling layer 310 in FIG. 7, in an embodiment, three or more layers may be stacked on the first panel-sheet coupling layer 310.

The second panel-sheet coupling layer 320 may be step-wise in cross-sectional shape. The side surface of the first layer 321 may protrude outwardly from the side surface of the second layer 322. In other words, the side of the second layer 322 may be located more to the inside than the side of the first layer 321. The thickness of the second panel-sheet coupling layer 320 may be equal to the thickness of the first layer 321 at both side portions, while the thickness may be equal to the sum of the thickness of the first layer 321 and the thickness of the second layer 322 in the center portion. The thickness of the second panel-sheet coupling layer 320 may become larger toward the center portion.

The curved area CA under the display panel 100 may become more concave toward the center portion of the curved area CA. That is, the distance d2 between the lower surface 100b of the display panel 100 and the upper surface 200a of the bottom panel 200 can be increased toward the center of the curved area CA. When the second panel-sheet coupling layer 320 is made up of more than one layer, its thickness may be equal to the distance d2. That is, the thickness of the second panel-sheet coupling layer 320 may be thicker toward the center to conform to the shape of the curved area CA.

As described above, the second panel-sheet coupling layer 320 may be deformed along the shape of the lower surface 100b of the display panel 100 during the pressing process. However, such deformation of the second panel-sheet coupling layer 320 may not be sufficient. In contrast, by forming the second panel-sheet coupling layer 320 as multiple layers to have different thicknesses for different areas, it is possible to more effectively fill the curved area CA of the lower surface 100b of the display panel 100 by the pressing process. In an embodiment, only the first layer 321 is disposed where the distance d2 between the display panel 100 and the panel bottom sheet 200 is relatively small, whereas the second layer 322 as well as the first layer 321 are disposed together where the distance d2 is relatively large, such that the space between the display panel 100 and the panel bottom sheet 200 can be filled with the panel-sheet coupling layer 301 to leave no empty space.

Figure 8:
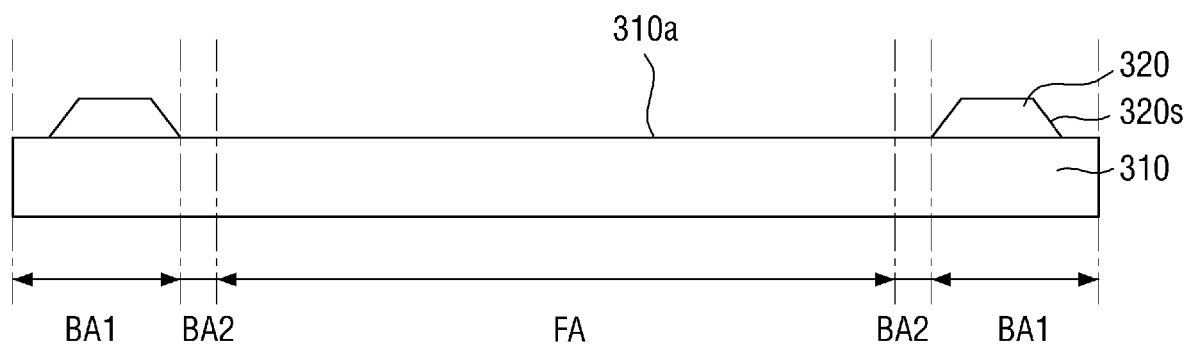

Referring to FIG. 8, a panel-sheet coupling layer 302 according to an exemplary embodiment of the present disclosure is different from the panel-sheet coupling layer 300 shown in FIG. 1 in that side surfaces 320s of a second panel-sheet coupling layer 320 are inclined with respect to an upper surface 310a of a first panel-sheet coupling layer 310.

The cross-sectional shape of the second panel-sheet coupling layer 320 may be a trapezoidal shape of which a width becomes narrower from the bottom to the top.

The inclination of the side surfaces 320s of the second panel-sheet coupling layer 320 can be adjusted according to the shape of the arc formed on the lower surface 100b of the display panel 100. As described above, the distance d2 between the display panel 100 and the panel bottom sheet 200 in the first bending area BA1 may not be constant. That is, the distance d2 may gradually increase from the boundary between the first bending area BA1 and the second bending area BA2 toward the center portion of the first bending area BA1, and then it may gradually decrease toward the outer side. The thickness of the second panel-sheet coupling layer 320 may gradually increase toward the center portion according to the distance d2. That is, the thickness of the second panel-sheet coupling layer 320 is small where the distance d2 is small, and the thickness of the second panel-sheet coupling layer 320 is large where the distance d2 is large.

Figure 9:
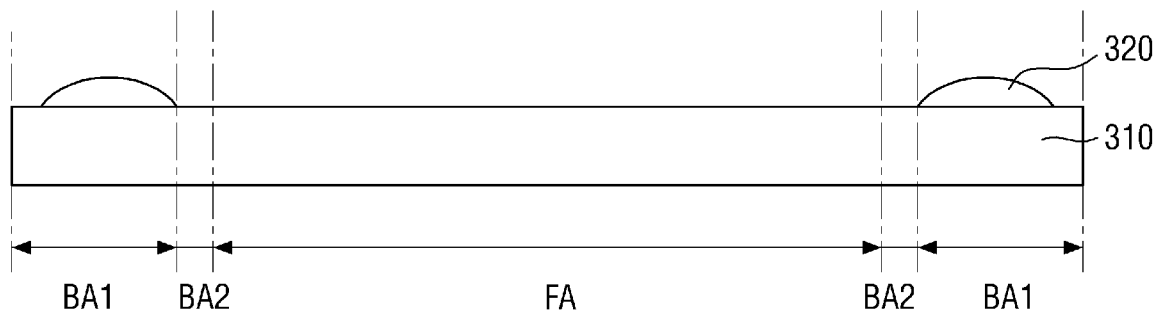

Referring to FIG. 9, a panel-sheet coupling layer 303 according to an exemplary embodiment of the present disclosure is different from the panel-sheet coupling layer 300 shown in FIG. 1 in that a second panel-sheet coupling layer 320 has a semicircular cross-sectional shape.

In an embodiment, the second panel-sheet coupling layer 320 has a semicircular cross-sectional shape, which extends continuously along a side of the first panel-sheet coupling layer 310.

The spacing between the display panel 100 and the bottom panel 200 has a tunnel-like shape that is closer to a hemisphere than a quadrangle. Therefore, the spacing can be filled more effectively with the second panel-sheet coupling layer 320 having a lenticular shape.

Figure 10:

Referring to FIG. 10, a panel-sheet coupling layer 304 according to an exemplary embodiment of the present disclosure may include a first panel-sheet coupling layer 310 and a second panel-sheet coupling layer 320 integrally formed.

The panel-sheet coupling layer 300 of FIG. 1 illustrates an example in which the second panel-sheet coupling layer 320 is stacked on the first panel-sheet coupling layer 310. In contrast, the panel-sheet coupling layer 304 according to the embodiment of FIG. 10 may include the second panel-sheet coupling layer 320 protruding from the upper surface of the first panel-sheet coupling layer 310.

The second panel-sheet coupling layer may not include a substrate. The second panel-sheet coupling layer may include only a coupling layer.

When the first panel-sheet coupling layer 310 and the second panel-sheet coupling layer 320 are integrally formed as a single element, redundant elements can be omitted, such that the thickness of the panel-sheet coupling layer 304 can be reduced without weakening the coupling. That is, by eliminating the substrate included in the second panel-sheet coupling layer 320, the thickness can be reduced by the thickness of the substrate.

Figure 11:
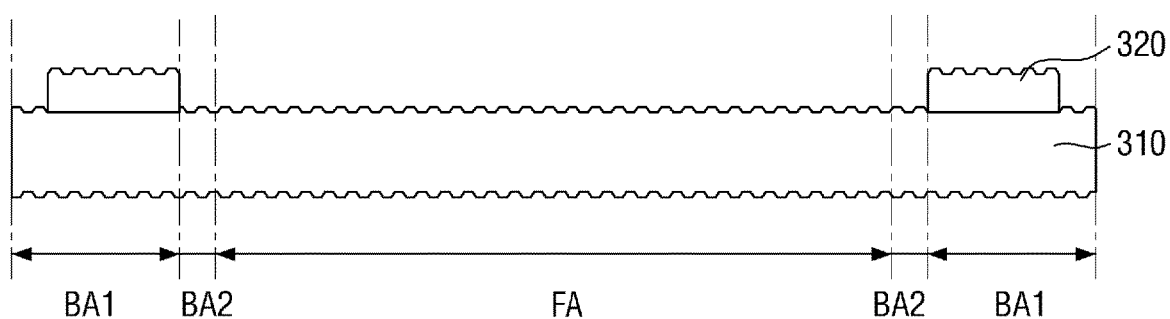

Referring to FIG. 11, a panel-sheet coupling layer 305 according to an exemplary embodiment of the present disclosure may have an embossed shape on the surface.

Although FIG. 11 depicts that the embossed shapes may be formed on both the upper and lower surfaces of the panel-sheet coupling layer 305, this is merely illustrative. That is, in an embodiment, the embossed shape may be formed on only one of the upper and lower surfaces.

When the embossed shape is formed on the surface of the panel-sheet coupling layer 305, the embossed shape on the surface may serve as an air passage to reduce air bubbles during the process of coupling the panel-sheet coupling layer 305 with the display panel 100 and/or the process of coupling the panel-sheet coupling layer 305 with the panel bottom sheet 200. After the panel-sheet coupling layer 305 is coupled with the display panel 100 and/or the panel bottom sheet 200 completely, the embossed shape on the surface of the panel-sheet coupling layer 305 may be collapsed and flattened.

Figure 12:
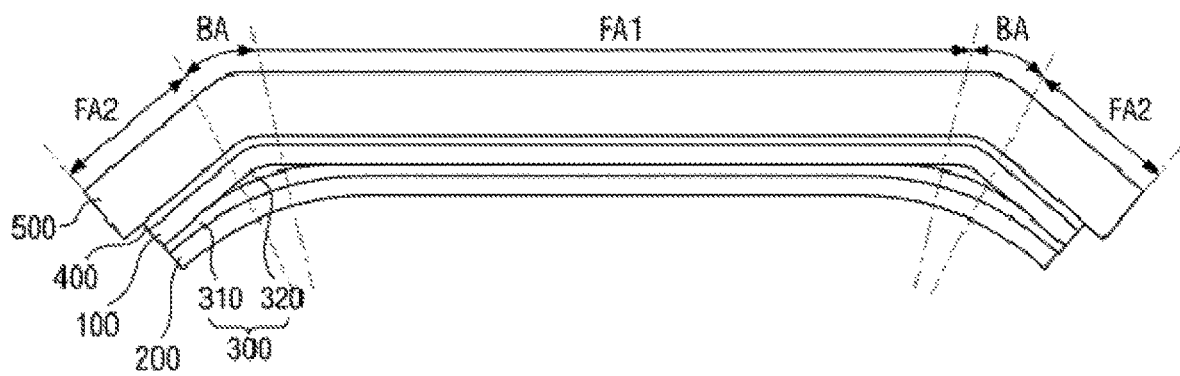
FIG. 12 is a cross-sectional view of a display device according to another exemplary embodiment of the present disclosure.

FIG. 12 is a cross-sectional view of a display device according to another exemplary embodiment of the present disclosure.

Referring to FIG. 12, a display device 2 may include a first flat area FA1, a second flat area FA2, and a bending area BA connecting the first flat area FA1 with the second flat area FA2.

The first flat area FA1 is not in the same plane with the second flat area FA2. That is, the first flat area FA1 may intersect with or cross the second flat area FA2. The window 500, the display panel 100, and the panel bottom sheet 200 are disposed across the first flat area FA1, the bending area BA, and the second flat area FA2.

The second panel-sheet coupling layer 320 may be disposed in the bending area BA. In an embodiment, the second panel-sheet coupling layer 320 may be in a line shape that is extended continuously along the side of the first panel-sheet coupling layer 310. One side of the second panel-sheet coupling layer 320 is disposed adjacent to the boundary between the bending area BA and the first flat area FA1, and the opposite side is disposed adjacent to the boundary between the bending area BA and the second flat area FA2.

Unlike the embodiment of FIG. 1, since the second flat area FA2 includes only the flat surface, the restoring force may hardly act in the second flat area FA2. On the other hand, the curvature may be increased as the bending area BA connecting the first flat area FA1 with the second flat area FA2 becomes smaller. That is, the radius of curvature, which is the reciprocal of the curvature, may be reduced. As a result, the panel bottom sheet 200 may have a restoring force in the bending area BA.

As described above, when the panel bottom sheet 200 is returned to the original flat shape by the restoring force, the panel bottom sheet 200 may be detached from the display panel 100, such that problems may arise, such as poor performance of the panel bottom sheet 200 and failures, such as resulting from moisture.

By disposing the second panel-sheet coupling layer 320 at a location where the restoring force acts strongly, that is, at the bending area BA, the bent portion is filled with the second panel-sheet coupling layer 320, such that and the radius of curvature is increased. Accordingly, the panel bottom sheet 200 disposed under the second panel-sheet coupling layer 320 may have a gentler slope than the display panel 100, such that a restoring force acting on the panel bottom sheet 200 can be reduced. Further, the thickness of the coupling layer is increased, and thus the coupling is enhanced.

As a result, it is possible to prevent or substantially prevent the panel bottom sheet 200 from being detached from the display panel 100, and to suppress failures resulting from moisture.

Although some exemplary embodiments of the present disclosure have been described with reference to the accompanying drawings, those skilled in the art would understand that various modifications and alterations may be made without departing from the spirit and scope of the present disclosure. Therefore, it should be understood that the above-mentioned embodiments are not limiting but, rather, are illustrative in all aspects.

What is claimed is:

1. A display device comprising:
a display panel comprising a flat area and a bending area positioned adjacent to the flat area;
a panel bottom sheet arranged under the display panel and overlapping with the flat area and the bending area; and
a panel-sheet coupling layer between the display panel and the panel bottom sheet and comprising a first panel-sheet coupling part arranged across the flat area and the bending area, and a second panel-sheet coupling part overlapping with the bending area and extended continuously along a side of the first panel-sheet coupling part,
wherein a thickness of the panel-sheet coupling layer becomes smaller from a central portion of the bending area toward a side portion of the bending area, and
wherein the panel bottom sheet has a curved shape that is gentler than a curved shape of the display panel.

2. The display device of claim 1, wherein the bending area comprises a first bending area and a second bending area having a larger radius of curvature than that of the first bending area, wherein the second bending area is arranged between and connects the first bending area and the flat area, and
wherein the second panel-sheet coupling part is arranged in the first bending area.

3. The display device of claim 2, wherein a side surface of the second panel-sheet coupling part is substantially aligned with a boundary between the first bending area and the second bending area, and an opposite side surface of the second panel-sheet coupling part is arranged more to an inside than a side portion of the first panel-sheet coupling part.

4. The display device of claim 3, wherein the second panel-sheet coupling part is between the first panel-sheet coupling part and the display panel.

5. The display device of claim 4, wherein, in the first bending area, a lower surface of the display panel contacts the first panel-sheet coupling part and the second panel-sheet coupling part.

6. The display device of claim 4, wherein a radius of curvature of an upper surface of the panel-sheet coupling layer is substantially equal to a radius of curvature of a lower surface of the display panel, and a radius of curvature of a lower surface of the panel-sheet coupling layer is substantially equal to a radius of curvature of the panel bottom sheet.

7. The display device of claim 6, wherein, in the first bending area, a radius of curvature of the upper surface of the panel-sheet coupling layer is smaller than a radius of curvature of the lower surface of the panel-sheet coupling layer.

8. The display device of claim 2, wherein, in the first bending area, the panel bottom sheet has a curved shape that is gentler than a curved shape of the display panel.

9. The display device of claim 8, wherein a first distance is smaller than a second distance, wherein the first distance is a vertical distance between the display panel and the panel bottom sheet in the flat area, and the second distance is a vertical distance between the display panel and the panel bottom sheet at a center of the first bending area.

10. The display device of claim 9, wherein a vertical distance between the display panel and the panel bottom sheet in the second bending area is equal to the first distance.

11. The display device of claim 1, wherein the panel-sheet coupling layer comprises a first panel-sheet coupling layer and a second panel-sheet coupling layer stacked on the first panel-sheet coupling layer,
wherein the first panel-sheet coupling layer forms the first panel-sheet coupling part, and the second panel-sheet coupling layer forms the second panel-sheet coupling part.

12. The display device of claim 1, wherein the second panel-sheet coupling part protrudes from an upper surface of the first panel-sheet coupling part toward the display panel, and wherein the first panel-sheet coupling part and the second panel-sheet coupling part are integrally formed.

13. The display device of claim 1, wherein the panel-sheet coupling layer comprises a substrate, a first coupling layer on the substrate, and a second coupling layer under the substrate.

14. The display device of claim 13, wherein the first coupling layer contacts the display panel, and the first coupling layer is thicker than the second coupling layer.

15. The display device of claim 1, wherein a side surface of the display panel, a side surface of the panel bottom sheet, and a side surface of the panel-sheet coupling layer are substantially aligned with one another.

16. The display device of claim 1, further comprising a window arranged on the display panel and overlapping with the flat area and the bending area.

17. A display device comprising:
a display panel comprising a flat area and a bending area located adjacent to the flat area; and
a coupling layer coupled with the display panel and comprising a first area arranged in the bending area to be bent with the bending area, and a second area arranged in the flat area,
wherein the coupling layer comprises a first coupling part arranged across the first area and the second area, and a second coupling part arranged on the first coupling part and overlapping with the first area,
wherein a thickness of the coupling layer decreases from a center portion of the first area toward an outer side of the first area, and
wherein the second coupling part is disposed between the first coupling part and the display panel.

18. The display device of claim 17, wherein the second coupling part extends continuously along a side of the first coupling part, and the second coupling part has a rectangular column shape or a lenticular shape.

19. A display device comprising:
a display panel comprising a first flat area, a second flat area positioned around the first flat area, and a bending area positioned between and connecting the first flat area with the second flat area;
a panel bottom sheet arranged under the display panel and overlapping with the first flat area, the second flat area, and the bending area; and
a panel-sheet coupling layer between the display panel and the panel bottom sheet and comprising a first panel-sheet coupling part arranged across the first flat area, the second flat area, and the bending area, and a second panel-sheet coupling part overlapping with the bending area and arranged on the first panel-sheet coupling part,
wherein a thickness of the panel-sheet coupling layer is larger in a center portion of the bending area than at a boundary between the bending area and the second flat area, and
wherein, in the bending area, a radius of curvature of the panel bottom sheet is larger than a radius of curvature of the display panel.

20. The display device of claim 19, wherein the second panel-sheet coupling part has a line shape extended continuously along a side of the first panel-sheet coupling part, and
wherein a side surface of the second panel-sheet coupling part is adjacent to a boundary between the first flat area and the bending area, and an opposite side surface of the second panel-sheet coupling part is adjacent to a boundary between the second flat area and the bending area.

* * * * *